United States Patent [19]

Tyznik

[11] Patent Number: 5,074,035
[45] Date of Patent: Dec. 24, 1991

[54] METHOD OF MAKING THIN FILM LAMINATE PRINTED CIRCUIT

[75] Inventor: John C. Tyznik, Houston, Tex.

[73] Assignee: Excello Circuits, Houston, Tex.

[21] Appl. No.: 382,718

[22] Filed: Jul. 19, 1989

[51] Int. Cl.$^5$ .......................... H05K 3/00; B32B 31/00
[52] U.S. Cl. ........................................ 29/830; 29/840; 29/843; 29/848; 156/155; 156/182; 156/241; 156/247; 156/631; 156/902
[58] Field of Search ................. 29/843, 848, 846, 738, 29/739, 842, 844, 829, 831, 740, 741, 830, 840; 156/155, 182, 241, 247, 236, 629, 634, 901, 902, 631, 630

[56] References Cited

U.S. PATENT DOCUMENTS

| 3,956,043 | 5/1976 | Zahir et al. | 156/634 |
| 3,970,494 | 7/1976 | Pritchard | 156/155 |
| 3,972,755 | 8/1976 | Misfeldt | 156/303.1 |
| 4,329,779 | 5/1982 | England | 156/241 |
| 4,460,427 | 7/1984 | Haney et al. | 156/227 |
| 4,799,984 | 1/1989 | Rellick | 29/829 |
| 4,862,803 | 9/1989 | Nerheim et al. | 102/202.5 |

OTHER PUBLICATIONS

Tucker, T. J. and P. L. Stanton, Electrical Gurney: "A New Concept in Modeling of Energy Transfer from Electrically Exploded Conductors," Sandia Laboratories SAND 75-0244 (1975).
Schwarz, A. C., "A New Technique for Characterizing an Explosive for Shock Initiation Sensitivity", Sandia Laboratories, SAND 75-0314 (1975).
Brochure entitled "Exploding Foil Initiator Ordnance", Reynolds Industries System Inc. (San Ramon, CA), p. 4 (1985).
Kirk-Othmer Encyclopedia of Chemical Technology, 3d ed., vol. 21, p. 345, 1983.
Harper, C. A. ed., Handbook of Wiring, Cabling, and Interconnecting for Electronics, p.1-41, 1972.

Primary Examiner—David A. Simmons
Assistant Examiner—Chester T. Barry
Attorney, Agent, or Firm—Vaden, Eickenroht, Thompson, & Boulware

[57] ABSTRACT

Method of making a multilayer printed circuit including one or more thin film laminates having a circuit etched thereon without tearing, bending, or wrinkling the laminate during fabrication and which allows the use of standard multilayer etching and registration processes. The method involves the application of a low melting point plastic adhesive to a temporary backing for adhering a thin film laminate to the backing for etching and registration. A high melting point adhesive is then used to laminate an inner layer assembly to the thin film laminate/temporary backing assembly and the temporary backing removed by heating to the melting point of the plastic adhesive. The method can be used to make multilayer printed circuits or a circuit for a blasting cap for initiating the explosion of a secondary explosive.

14 Claims, 2 Drawing Sheets

METHOD OF MAKING THIN FILM LAMINATE PRINTED CIRCUIT

BACKGROUND OF THE INVENTION

The present invention relates to a method of making a multilayer, thin film laminate printed circuit and an electrically fired blasting cap for detonating a secondary explosive made from such a circuit. In more detail, the present invention relates to a method of making a multilayer printed circuit including a thin film laminate of a type which would likely be damaged if the circuit was made by conventional multilayer techniques. That method makes possible the construction of such a circuit for uses such as in a blasting cap.

A number of applications have developed over the past several years for multilayer printed circuit boards, and with those new applications has come increased difficulty in the manufacture of such circuits (see, for instance, R. Fidrych, "Low Pressure Lamination", 10 Printed Circuit Fabrication 46–53 (1987) for a brief summary). One of the design criteria which has contributed to the increased manufacturing difficulty has been the demand for circuits with more layers on thinner innerlayer materials (M. Angelo, "Multilayer Registration Tooling-The Full Spectrum", 10 Printed Circuit Fabrication 24–34 (1987)). In large part, these difficulties are the result of the fragility of the thin film laminates which have been developed for use in such multilayer printed circuit boards, which are easily wrinkled, bent, and/or torn during processing. These tendencies of the thin film laminates may even cause the majority of the multilayer circuits made during a particular production run to be rejects such that the cost of such circuits is so prohibitively high that few can afford them in quantity.

By the use of the phrase "thin film laminate", it is intended to refer to those materials which are laminates of, for instance, a conductive metal and a suitable plastic resin which are manufactured and used in thin film form. Examples of such materials include composites of copper and polyimide resins. For instance, throughout the present specification, reference is made to a laminate of copper and Kapton TM, the latter being a DuPont trademark for a proprietary polyimide resin. Such a laminate is available under the brand name Microclad TM (Fortin Industries, Inc., Sylmar, Calif.) in thicknesses as small as 0.0005 inches and Etch-A-Flex TM (Southwall Technologies, Palo Alto, Calif.). This copper/Kapton laminate, however, is merely illustrative of one type of thin film laminate with which the present invention may be utilized, the examples set out herein being set out for purposes of exemplification and compliance with the Patent Statute, and not by way of limitation.

Multilayer printed circuits, as noted above, have a number of applications. For purposes of exemplification, one such application of a circuit made in accordance with the method of the present invention is described herein, namely as a substitute for the primary explosive, or ignition primer charge, in an electrically fired detonator for a secondary explosive. A secondary explosive, or base charge, such as PETN, TNT, HNS, RDX or NONA is generally detonated by a blasting cap which includes an ignition primer charge such as low density nitromannite, diazodinitrophenol, lead styphnate or lead azide. The latter primary explosive is widely used in electrically fired detonators in the oil field, for instance, for perforating a casing. In that use, lead azide has caused many serious injuries and deaths to the personnel handling the charges as a result of untimely detonation, and it is one of the safer primary explosives. A thin film laminated circuit constructed in accordance with the present invention effectively removes all risk of untimely detonation of the base charge by completely replacing the primary explosive.

It is, therefore, an object of the present invention to provide a method of making a thin film laminate printed circuit board.

Another object of the present invention is to provide a multilayer printed circuit board including a thin film laminate.

Another object of the present invention is to provide a method of making a multilayer circuit board including a thin film laminate which can be etched and registered with a high degree of accuracy using standard multilayer techniques.

Another object of the present invention is to provide a method of making a multilayer circuit board in which a thin film laminate can be etched and registered using conventional multilayer techniques without bending, wrinkling or tearing the thin film.

Yet another object of the present invention is to provide an electrically fired blasting cap, or detonator, which includes a printed circuit board including a thin film laminate.

Another object of the present invention is to provide a blasting cap, or detonator, which significantly reduces the likelihood of injury of the personnel handling the explosives.

SUMMARY OF THE INVENTION

These objects, and the advantages, of the present invention are achieved by providing a method of making a multilayer, thin film laminate printed circuit board comprising the steps of applying a low melting point plastic adhesive to a temporary backing and then placing a thin film laminate over the plastic adhesive and applying heat and pressure to adhere the thin film laminate to the temporary backing to form a thin film laminate/temporary backing assembly on which a printed circuit can be etched and registered using multilayer techniques. A high temperature adhesive is then applied over the entire thin film laminate except the portions on which a connection for the printed circuit etched thereon is located and an inner layer assembly having solder applied to the electrical connection points thereof is placed on the high temperature adhesive under pressure and sufficient heat to cure the adhesive, thereby laminating the inner layer assembly to the thin film laminate/temporary backing assembly and reflowing the solder applied to the connection points to make the electrical connections between the inner layer assembly and the locations of the connections on the thin film laminate. The temporary backing is then removed from the thin film laminate/temporary backing assembly.

The resulting multilayer, thin film laminate printed circuit may comprise, for example, a base layer having two conductive metal pads deposited thereon, each of the conductive metal pads having a layer of solder applied thereto and being adapted for connecting to an electrical lead and a thin film laminate. A conductive metal bridge is etched on the thin film laminate, and a layer of high temperature adhesive laminates the base layer to the thin film laminate, each end of the conductive metal bridge being positioned over a respective conductive metal pad. The solder applied to the conductive metal pads conducts current therethrough to the conductive metal bridge.

Also provided is a blasting cap for electrical firing of a secondary explosive comprising a disc adapted for contacting a secondary explosive and having a hole therethrough into the secondary explosive and a base assembly having two conductive metal pads with a layer of solder applied thereto located thereon for connecting the electrical leads. A thin film laminate is applied to the side of the disc opposite the secondary explosive, and a conductive metal bridge is etched thereon. A layer of adhesive laminates the base assembly to the thin film laminate, the ends of the conductive metal bridge being positioned over the respective conductive metal pads of the base assembly. The solder applied to the conductive metal pads of the base assembly provides an electrical connection to the ends of the conductive metal bridge so that current applied to the conductive metal pads causes the metal of the bridge to vaporize and expand rapidly to drive a portion of the thin film laminate through the hole in the disc into the secondary explosive to detonate the secondary explosive.

DETAILED DESCRIPTION OF PREFERRED EMBODIMENT

The method of the present invention can best be described with reference to an actual example of a multilayer printed circuit including a thin film laminate. Consequently, the following description of a presently preferred embodiment of the method will refer to the multilayer, thin film laminate printed circuit board made by that method for use in connection with a blasting cap constructed in accordance with the present invention. It will be understood, however, by those skilled in the art who have the benefit of this disclosure that the method of the present invention is not restricted to a method of making only this particular circuit board and that any circuit board including a thin film laminate may conveniently be constructed by using this method. The following description is, therefore, merely an exemplary description of a method of making such a circuit board.

Figure 1:
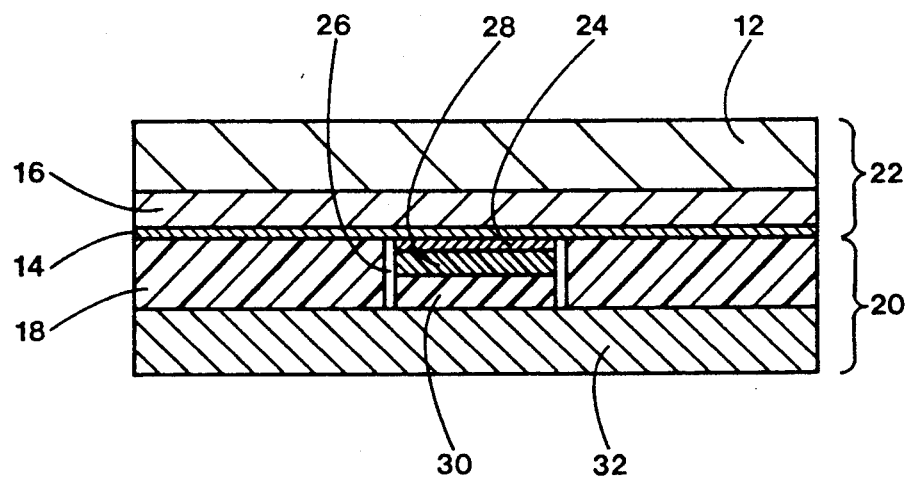
FIG. 1 is a sectional view of a multilayer printed circuit board including a thin film laminate during a step in the process of making that printed circuit board in which the temporary backing used in making that printed circuit board is adhered to the thin film laminate.

Referring first to FIG. 1, there is shown a circuit board 10 in the process of being made by the method of the present invention. At the particular stage in the method of the present invention shown in FIG. 1, the circuit board 10 has been completed and awaits the step of removing the temporary backing 12 therefrom as will be described below. At this stage, circuit board 10 is comprised of the temporary backing 12, which is adhered to a thin film laminate 14 such as the copper/Kapton TM laminate described above and sold under the brand name Microclad TM by a low melting point plastic adhesive 16. Also laminated to the thin film laminate 14 by a layer of thermally cured, high temperature adhesive 18 is an inner layer assembly 20. Construction of printed circuit board 10 is accomplished as follows.

The temporary backing 12, which can be, for instance, on the order of 0.020 inches thick, is cut to the desired size, as is the thin film laminate 14, and registration holes (not shown) are drilled in both the backing 12 and thin film laminate 14. Any of a number of resins may be used to advantage as the temporary backing. Particular success has been achieved using an FR4 resin system, but BT and FR5 resin systems may also be appropriate for use as temporary backing 12. A layer of low melting point plastic adhesive 16 is applied to one side of backing 12 and the thin film laminate 14 placed over the low melting point plastic 16 and pressed in, for instance, a vacuum hydraulic heat or hydraulic heat press to adhere the thin film laminate 14 to temporary backing 12 to form a thin film laminate/temporary backing assembly 22.

This assembly 22 is heated to a temperature above the melting point of the plastic adhesive 16 with sufficient pressure to remove all air pockets that might exist between layers. Those skilled in the art who have the benefit of this disclosure will recognize that a wide variety of low melting point plastic adhesives 16 may be appropriate for use in connection with the method of the present invention and that the particular plastic adhesive 16 used will influence the combination of time, pressure, and heat which is applied to bond the thin film laminate 14 to temperature backing 12. Particular success has been achieved in accordance with the method of the present invention by utilizing a wax such as beeswax or paraffin as a plastic adhesive 16, pressed for about 1 to about 60+ minutes in either a hydraulic heat or vacuum hydraulic heat press at temperatures from ambient temperature up to about 375° F. at about 40 up to about 350 psi and then cooling for about 1 to about 60+ minutes to room temperature with pressure still applied. The pressure is then released and the thin film laminate/temporary backing assembly 22 removed from the press is of sufficient thickness to use standard printed circuit board registration and etching processes as is known in the art.

Referring still to FIG. 1, there is shown a circuit in which the thin film laminate 14 has been etched using a standard process so as to remove the copper 24 therefrom except in the central portion for use in the blasting cap shown in FIGS. 2-4 as will be described. After the circuit is etched into the thin film laminate 14, the high temperature adhesive 18 is applied to the surface of the thin film laminate 14 except in the portions 26 on which a connection for the copper 24 of the printed circuit etched thereon is located. An inner layer assembly 20 having solder 28 applied to the electrical connection points, such as the conductive metal pad(s) 30 thereof, is placed on the high temperature adhesive 18. Inner layer assembly 20 is laminated to the thin film laminate/temporary backing assembly 22 by pressing under temperature, pressure and time conditions sufficient to cure the high temperature adhesive 18 and to remove air pockets therefrom, the heat reflowing the solder 28 applied to the electrical connection points for the circuit etched on thin film laminate 14 (represented by the copper 24), e.g., conductive metal pads 30, to make the electrical connections between the inner layer assembly 20 and the circuit etched on thin film laminate 14.

Those skilled in the art who have the benefit of this disclosure will recognize that a wide variety of high temperature adhesives 18 may be appropriate for use in connection with the method of the present invention and that the particular adhesive 18 used will influence the combination of heat, time, and pressure which is applied to laminate the inner layer assembly 20 to the thin film laminate/temporary backing assembly 22. Particular success has been achieved in accordance with the method of the present invention by utilizing a Dow Corning silicone pressure sensitive adhesive sold under the product designation "Q2-7406 Adhesive" cured with the catalyst in accordance with the instructions provided with that product. Other high temperature adhesives may also be utilized to advantage as long as the adhesive will withstand the temperature to which the circuit 10 is heated to remove temporary backing 12. Representative process parameters involve pressing in either a hydraulic heat or vacuum hydraulic heat press at between about 150° to about 400° F. at about 40 up to about 350 psi and then cooling to room temperature (about 1 to about 60+ minutes). The pressure is then released and the printed circuit board 10 removed from the press.

In the final step, the temperature backing 12 is removed from the thin film laminate/temporary backing assembly 22. Removal of the temporary backing 12 is preferably accomplished by placing the printed circuit board 10 in an oven at a temperature sufficient to melt the low melting point adhesive, 16, e.g., about 225° F. and then washing with trichloroethane. Other solvents and/or heats may be required depending upon the particular materials utilized, as set out above.

Those skilled the art will recognize that the inner layer assembly 20 described above, comprised of a base layer 32 having conductive metal pads 30 deposited thereon to serve as the electrical connection point for the circuit etched on thin film laminate 14, could also be a second thin film laminate/temporary backing assembly such as the thin film laminate/temporary backing assembly 22. By repeating the steps of the method described above with a second such assembly, and then with additional such assemblies, a multilayer printed circuit comprised of many thin film laminates is made in accordance with the method of the present invention using standard etching and registration techniques.

Figure 2:
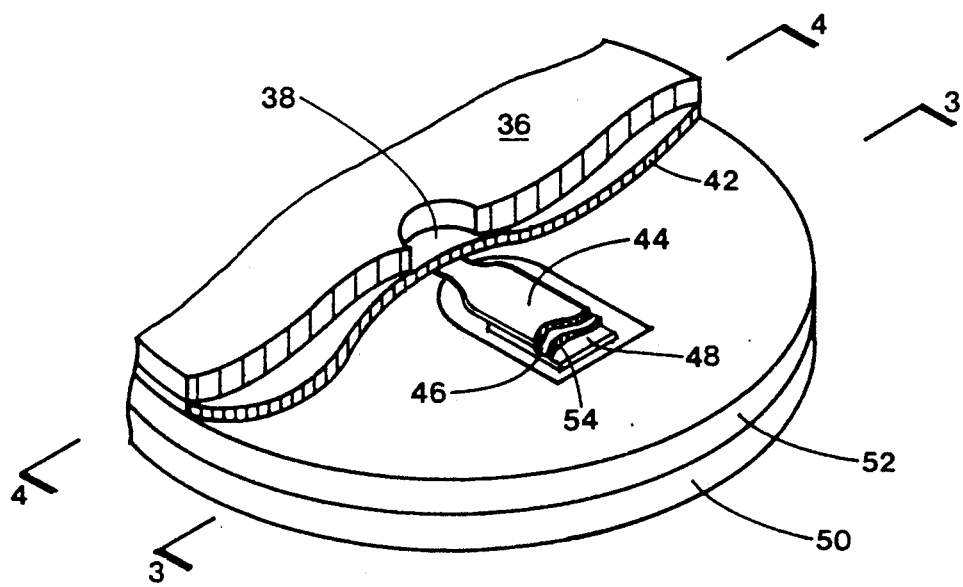
FIG. 2 is a perspective, partially cutaway view of a blasting cap including a multilayer, thin film laminate printed circuit board constructed in accordance with the method of the present invention.
Figure 3:
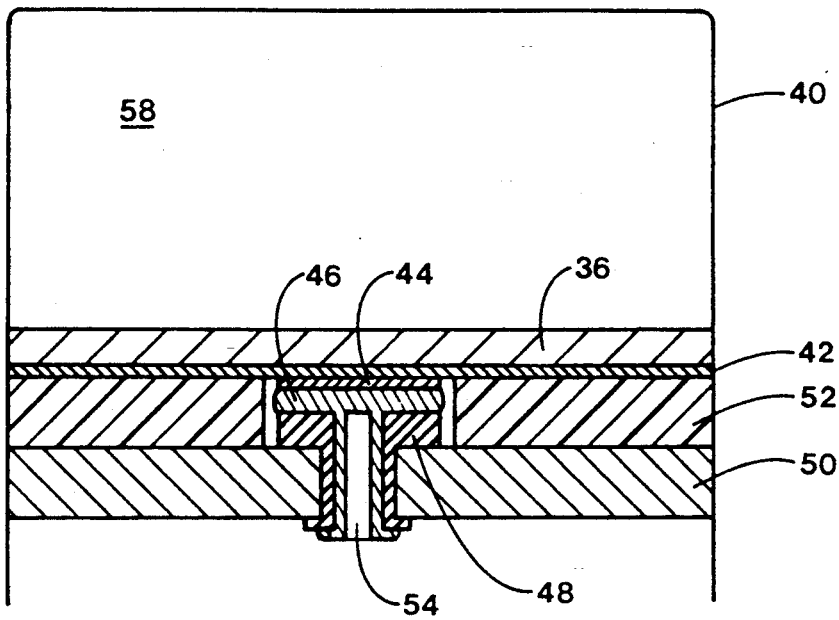
FIG. 3 is a sectional view taken along the lines 3—3 in FIG. 2.
Figure 4:
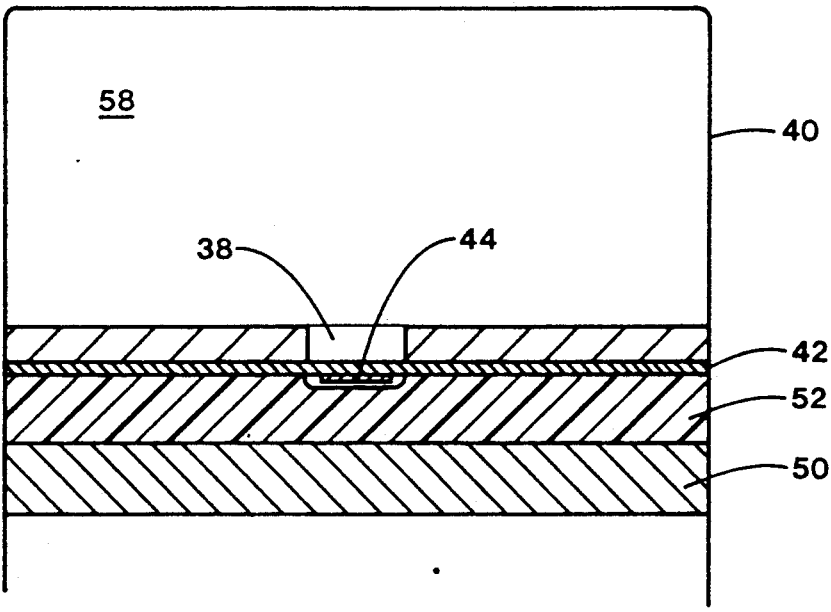
FIG. 4 is a sectional view taken along the lines 4—4 in FIG. 2.

Referring now to FIGS. 2-4, there is shown a detonator circuit for a blasting cap which is conveniently made in accordance with the method of the present invention. Electronic circuits presently in use for explosive initiation make use of a barrel formed from a ceramic disc, which may be an aluminum composite or material such as synthetic ruby or TTZ (transformation-hardened zirconium), having a hole 38 therethrough which is, for reasons which will be made apparent, referred to as a barrel. Explosive initiators including such structure were developed in the 1970's, may be described as exploding foil initiators, and are available from such suppliers as Reynolds Industries Systems, Inc. (San Ramon, Calif.). As described in the sales literature of Reynolds Industries Systems, Inc., such initiators consist of the output, or secondary explosive, having an insulation disc with a hole in the center adjacent thereto. An insulating flyer material such as Mylar ™ having a metal foil etched on one side thereof is placed against the disc. The metal foil has a narrow neck, or bridge, which vaporizes when high current is applied to the metal foil, shearing the insulated flyer, which accelerates down the hole in the disc and impacts the pellet of output explosive, causing detonation.

In general, the ability of such initiators to detonate a secondary explosive depends upon the impact energy of the flyer, and the higher the velocity of the flyer, the more impact energy such that initiation is more reliable. All other parameters being equal, the thinner the material comprising the insulating disk, the higher the velocity of the flyer. Unfortunately, the same difficulties described above for making multilayer circuit boards increase the cost of detonators having thin disks. Hence, the circuit of the present invention, which utilizes the laminate material which is very thin but which can be processed in accordance with the method of the present invention, represents a significant improvement over the initiators presently known.

That circuit is comprised of a ceramic or other composite layer 36, which may be crimped or otherwise secured in a casing 40 as is known in the art, having a hole 38 therethrough. Particularly satisfactory results have been achieved using a 0.03 inch thick layer of 94% aluminum oxide as the material comprising composite layer 36. Immediately adjacent composite layer 36 is a Kapton ™ layer 42 having a copper bridge 44 etched thereon in accordance with the method of the present invention. Electrical connections are provided to copper bridge 44 by the solder 46 applied to the conductive metal pads 48 deposited on a base layer 50 which is laminated to the Kapton layer 42 by a high temperature adhesive 52. A plated through hole 54 is provided under conductive metal pad 48 that is lined with solder 46 for receiving an electrical lead (not shown) for applying high current to copper bridge 44 to vaporize the bridge 44 in the area under hole 38, causing a disc, or bullet (not shown), of Kapton to be driven through the hole, or barrel 38. Conductive metal pads 48 and plated through hole 54 are formed in base layer 50 by drilling, electroless plating followed by electroplating of copper, and then solder plating as is known in the art. The Kapton "bullet" impacts the secondary explosive 58 to initiate the explosion.

Although the invention has been described in terms of the presently preferred embodiments thereof, it will be recognized by those skilled in the art who have the benefit of this disclosure that certain changes can be made to the invention without departing from the spirit and scope thereof. For instance, the time, heat and pressure applied to the various assemblies for lamination can, and should, be changed depending upon the materials utilized. Removal of the temporary backing may be accomplished with a knife or by chemical means. An insulator may be laminated between layer of thin film laminates in a multilayer circuit. Further, there is no limitation as to the type of circuit which can be etched onto thin film laminate. All such changes, and many others, are intended to fall within the scope of the following claims.

What is claimed is:

1. A method of making a multilayer thin film laminate printed circuit board comprising the steps of:
   (a) applying a first plastic adhesive to a temporary backing;

(b) placing a thin film laminate including a metal layer over said first adhesive and adhering the thin film laminate to the temporary backing to form a thin film laminate/temporary backing assembly;

(c) etching a circuit onto the thin film laminate of the thin film laminate/temporary backing assembly;

(d) applying a second adhesive over the entire thin film laminate except the portions at which electrical connection for the circuit etched thereon is to be made;

(e) placing an inner layer assembly having solder applied to the electrical connection points thereof on the second adhesive and laminating the inner layer assembly to the thin film laminate/temporary backing assembly, the solder applied to the metal of the thin film laminate thereby making electrical connection between the inner layer assembly and the circuit etched on the thin film laminate; and (f) removing the temporary backing from the thin film laminate/temporary backing assembly.

2. The method of claim 1 wherein the thin film laminate is adhered to the temporary backing by applying heat and pressure thereto.

3. The method of claim 2 wherein the thin film laminate is adhered to the temporary backing by applying about 200±25 psi at a temperature of from about 300° to about 350° F.

4. The method of claim 1 where the thin film laminate/temporary backing assembly is laminated to the inner layer assembly by applying heat and pressure thereto.

5. The method of claim 4 wherein the thin film laminate/temporary backing assembly is laminated to the inner layer assembly by applying about 220±25 psi at a temperature of from about 300° to about 350° F.

6. The method of claim 1 wherein the temporary backing is removed by heating to a temperature higher than the melting point of the said first adhesive.

7. The method of claim 6 wherein the temporary backing is removed by heating to about 225° F.

8. The method of claim 6 additionally comprising washing the plastic layer of the thin film laminate after removing said first adhesive with a solvent capable of dissolving said first adhesive.

9. The method of claim 1 wherein the inner layer assembly comprises a second thin film laminate/temporary backing assembly and the temporary backing that is removed in step (f) is either the temporary backing of the first thin film laminate/temporary backing assembly or the temporary backing of the second thin film laminate/temporary backing assembly, or both.

10. The method of claim 1 wherein the thin film laminate/temporary backing assembly is laminated to the inner layer assembly by applying sufficient heat thereto to cure the adhesive and reflow the solder applied to the electrical connection points.

11. A method of making a multilayer, thin film laminate printed circuit board comprising the steps of:

(a) applying a layer of low melting point plastic adhesive to a temporary backing;

(b) placing a thin film laminate including a metal layer over the layer of low melting point plastic adhesive and applying heat and pressure thereto to adhere the thin film laminate to the temporary backing to form a thin film laminate/temporary backing assembly;

(c) etching a circuit on said metal layer of the thin film laminate of the thin film laminate/temporary backing assembly;

(d) applying a high temperature adhesive over the entire thin film laminate of the thin film laminate/temporary backing assembly except in the portions at which electrical connection for the circuit etched thereon is to be made;

(e) placing an inner layer assembly having solder applied to the electrical connection points thereof on the high temperature adhesive and applying pressure and sufficient heat thereto to cure the adhesive, thereby laminating the inner layer assembly, and to reflow the solder applied to the electrical connection points to make electrical connection between the inner layer assembly and the circuit etched on the thin film laminate; and (f) removing the temporary backing from the thin film laminate/temporary backing assembly.

12. The method of claim 1 wherein the inner layer assembly comprises a second thin film laminate/temporary backing assembly, the temporary backing of the second thin film laminate/temporary backing assembly being removed in step (e) thereof.

13. A method of making a multilayer thin film laminate printed circuit board comprising the steps of:

(a) adhering a thin film laminate including a metal layer temporary backing with a first adhesive to form a first thin film laminate/temporary backing assembly;

(b) etching a printed circuit onto said metal layer of the thin film laminate of the first thin film laminate/temporary backing assembly;

(c) applying a second adhesive to the thin film laminate of the first thin film laminate/temporary backing assembly;

(d) placing the thin film laminate of a second thin film laminate/temporary backing assembly having a circuit etched on the thin film laminate thereof on the second adhesive and applying heat and pressure thereto to laminate the first and second thin film laminates to each other; and (e) removing one or both of the temporary backings of the first and second thin film laminate/temporary backing assemblies by heating to a temperature higher than the melting point of the first adhesive, the second adhesive having a higher melting point than the first adhesive.

14. The method of claim 13 additionally comprising applying solder to the electrical connection points of the thin film laminates of the first and second thin film laminate/temporary backing assemblies and applying sufficient heat when laminating the first and second thin film laminates to each other to cure the second adhesive and reflow the solder.

* * * * *